United States Patent
Sansbury

(10) Patent No.: US 6,282,122 B1
(45) Date of Patent: Aug. 28, 2001

(54) EVALUATION OF MEMORY CELL CHARACTERISTICS

(75) Inventor: James D. Sansbury, Portola Valley, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/465,223

(22) Filed: Dec. 14, 1999

Related U.S. Application Data

(62) Division of application No. 09/304,625, filed on May 4, 1999, which is a division of application No. 08/915,519, filed on Aug. 14, 1997, now Pat. No. 5,959,891.
(60) Provisional application No. 60/024,063, filed on Aug. 16, 1996.

(51) Int. Cl.$^7$ .................................................. G11C 16/04
(52) U.S. Cl. .............................. 365/185.24; 365/185.18; 365/185.14; 365/185.01; 365/185.02
(58) Field of Search .................... 365/189.01, 185.01, 365/185.14, 185.18, 185.24, 185.02

(56) References Cited

U.S. PATENT DOCUMENTS

| | | | |
|---|---|---|---|
| 4,132,904 | 1/1979 | Harari | 307/238 |
| 4,546,454 | 10/1985 | Gupta et al. | 365/200 |
| 4,596,938 | 6/1986 | Cartwright, Jr. | 307/279 |
| 4,609,986 | 9/1986 | Hartmann et al. | 364/200 |
| 4,617,479 | 10/1986 | Hartmann et al. | 307/465 |
| 4,628,487 | 12/1986 | Smayling | 365/185 |
| 4,652,773 | 3/1987 | Cartwright, Jr. | 307/469 |
| 4,677,318 | 6/1987 | Veenstra et al. | 307/465 |
| 4,713,792 | 12/1987 | Hartmann et al. | 364/900 |
| 4,788,460 | 11/1988 | Kobatake | 307/530 |
| 4,829,203 | 5/1989 | Ashmore, Jr. | 307/469 |
| 4,871,930 | 10/1989 | Wong et al. | 307/465 |
| 4,885,719 | 12/1989 | Brahmbhatt | 365/181 |
| 4,887,242 | 12/1989 | Hashimoto | 365/238.5 |
| 4,899,067 | 2/1990 | So et al. | 307/465 |
| 4,912,342 | 3/1990 | Wong et al. | 307/465 |
| 4,924,119 | 5/1990 | Lee | 307/469 |
| 4,935,648 | 6/1990 | Radjy et al. | 307/468 |
| 4,979,146 | 12/1990 | Yokoyama et al. | 365/185 |
| 5,005,155 | 4/1991 | Radjy et al. | 365/185 |
| 5,016,217 | 5/1991 | Brahmbhatt | 365/185 |
| 5,021,693 | 6/1991 | Shima | 307/494 |
| 5,028,810 | 7/1991 | Castro et al. | 307/201 |
| 5,043,941 | 8/1991 | Sakamoto | 365/185 |
| 5,097,449 | 3/1992 | Cuevas | 365/228 |
| 5,121,006 | 6/1992 | Pedersen et al. | 307/465 |
| 5,214,605 | 5/1993 | Lim et al. | 365/218 |
| 5,241,224 | 8/1993 | Pedersen et al. | 307/465 |
| 5,247,478 | 9/1993 | Gupta et al. | 365/185 |
| 5,260,610 | 11/1993 | Pedersen et al. | 307/465 |
| 5,260,611 | 11/1993 | Cliff et al. | 307/465 |
| 5,331,599 | 7/1994 | Yero | 365/226 |
| 5,350,954 | 9/1994 | Patel et al. | 307/465 |
| 5,353,248 | 10/1994 | Gupta | 365/154 |
| 5,386,388 | 1/1995 | Atwood | 365/201 |
| 5,434,815 | 7/1995 | Smarandoiu et al. | 365/189.01 |
| 5,457,653 | 10/1995 | Lipp | 365/185.18 |
| 5,572,054 | 11/1996 | Wang et al. | 257/322 |
| 5,949,710 | * 9/1999 | Pass et al. | 365/185.05 |
| B1 4,617,479 | 9/1993 | Hartmann et al. | 307/465 |

FOREIGN PATENT DOCUMENTS

| | | |
|---|---|---|
| WO 94/22142 | 9/1994 | (WO) . |
| WO 96/01474 | 1/1996 | (WO) . |
| WO 96/01499 | 1/1996 | (WO) . |

* cited by examiner

*Primary Examiner*—Viet Q. Nguyen
(74) *Attorney, Agent, or Firm*—Townsend and Townsend and Crew LLP

(57) ABSTRACT

Techniques are used to evaluate margin of programmable memory cells. In particular, techniques are used to measure negative erased threshold voltage levels. Techniques are used to increase the longevity and reliability of memory cells by adjusting a window of memory cell operation

24 Claims, 9 Drawing Sheets

EVALUATION OF MEMORY CELL CHARACTERISTICS

This application is a division of U.S. patent application Ser. No. 09/304,625, filed May 4, 1999, which is a division of U.S. patent application Ser. No. 08/915,519, filed Aug. 14, 1997 now U.S. Pat. No. 5,959,891, which claims priority from U.S. provisional patent application Ser. No. 60/024,063, filed Aug. 16, 1996, which are all incorporated by reference.

BACKGROUND OF THE INVENTION

The present invention relates to the field of integrated circuit memory technology. More specifically, the present invention provides techniques of evaluating characteristics of nonvolatile programmable memory cells and enhancing the reliability and service life of these memory cells.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits ASICs), among others. Memory cells are used to store the data and other information for these and other integrated circuits.

As integrated circuit technology and semiconductor processing continue to advance, there is a need for greater densities and functionality in integrated circuits, which are often determined in a large part b the size of the memory cells. Further, it is desirable that the memory cells have improved operating characteristics, such as lower power consumption, nonvolatility, greater device longevity, improved data retention, better transient performance, superior voltage and current attributes, and improvements in other similar attributes.

There is a further need for improved techniques of evaluating the physical characteristics of nonvolatile memory cells. These physical characteristics or properties are important in the determination of an integrated circuit's service life and reliability. These measurements are also useful for study and use in improving memory cells. One property of a memory cell is margin, including program and erase margin, indicating the degree to which a cell is in a programmed or erased state. The degree of margin comes from a determination of the threshold voltages in the programmed and erased states. In particular, the voltage threshold (VTE) of erased nonvolatile memory cells such as EEPROM or Flash cells may be negative. Present techniques only allow threshold measurements in the positive range. Using these techniques, a device with a negative erased threshold voltage is presumed to have an erased threshold voltage of zero volts. However, the value of the erased threshold voltage is important in characterizing the reliability and service life of a memory cell, and it is important to be able to measure negative threshold voltage.

As can be seen, improved techniques for evaluating margin of memory devices are needed, especially when the memory devices have negative erased threshold voltages. Improved techniques are also needed for improving the reliability and longevity of these memory devices.

SUMMARY OF THE INVENTION

The present invention provides techniques for characterizing memory devices, and in particular nonvolatile memory devices such as EEPROM and Flash cells. Specifically, the techniques of the present invention allow the measurement of negative threshold voltages. Erased nonvolatile memory cells will have negative threshold voltages in some implementations. The techniques of the present invention may be used to measure these negative values. Furthermore, the techniques of the present invention are also applicable to the measurement of similar characteristics or properties in many other situations. The present invention also provides for techniques to improve the reliability and longevity of memory cells.

Specifically, the present invention is a method of evaluating a threshold voltage of a programmed device including the following: sweeping a voltage range including negative voltages at a control gate line of the program device; and determining a voltage at which the program device begins to conduct. An embodiment of the present invention includes negatively biasing a substrate connection of the programmed device. An embodiment of the present invention includes elevating a source node of the program device with an offset voltage.

A further embodiment of the present invention includes decoupling memory cells adjacent to a selected memory cell by placing a negative voltage on control gates of the adjacent memory cells. An embodiment of the present invention includes decoupling memory cells adjacent to a selected memory cell by negatively biasing substrate connections of the adjacent memory cells. An embodiment of the present invention includes decoupling memory cells adjacent to a selected memory cell by placing a voltage on terminals of the adjacent memory cells such that a gate-to-source voltage for each cell is less than a turn-on threshold of the cell.

An embodiment of the present invention further provides techniques of operating a memory cell including coupling an offset voltage to source nodes of a plurality of memory cells; and determining a stored state of a selected one of the memory cells while the offset voltage is coupled to the source nodes.

Other objects, features, and advantages of the present invention will become apparent upon consideration of the following detailed description and the accompanying drawings, in which like reference designations represent like features throughout the figures.

DETAILED DESCRIPTION

Figure 1:
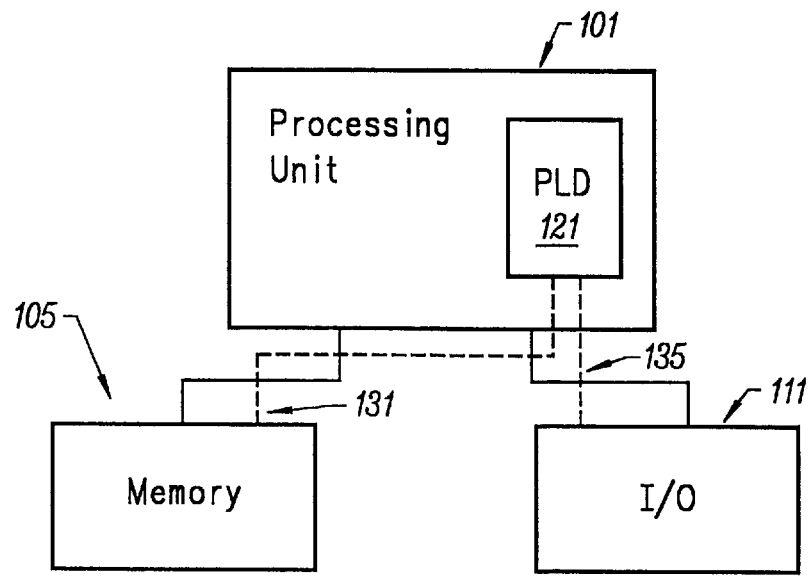
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
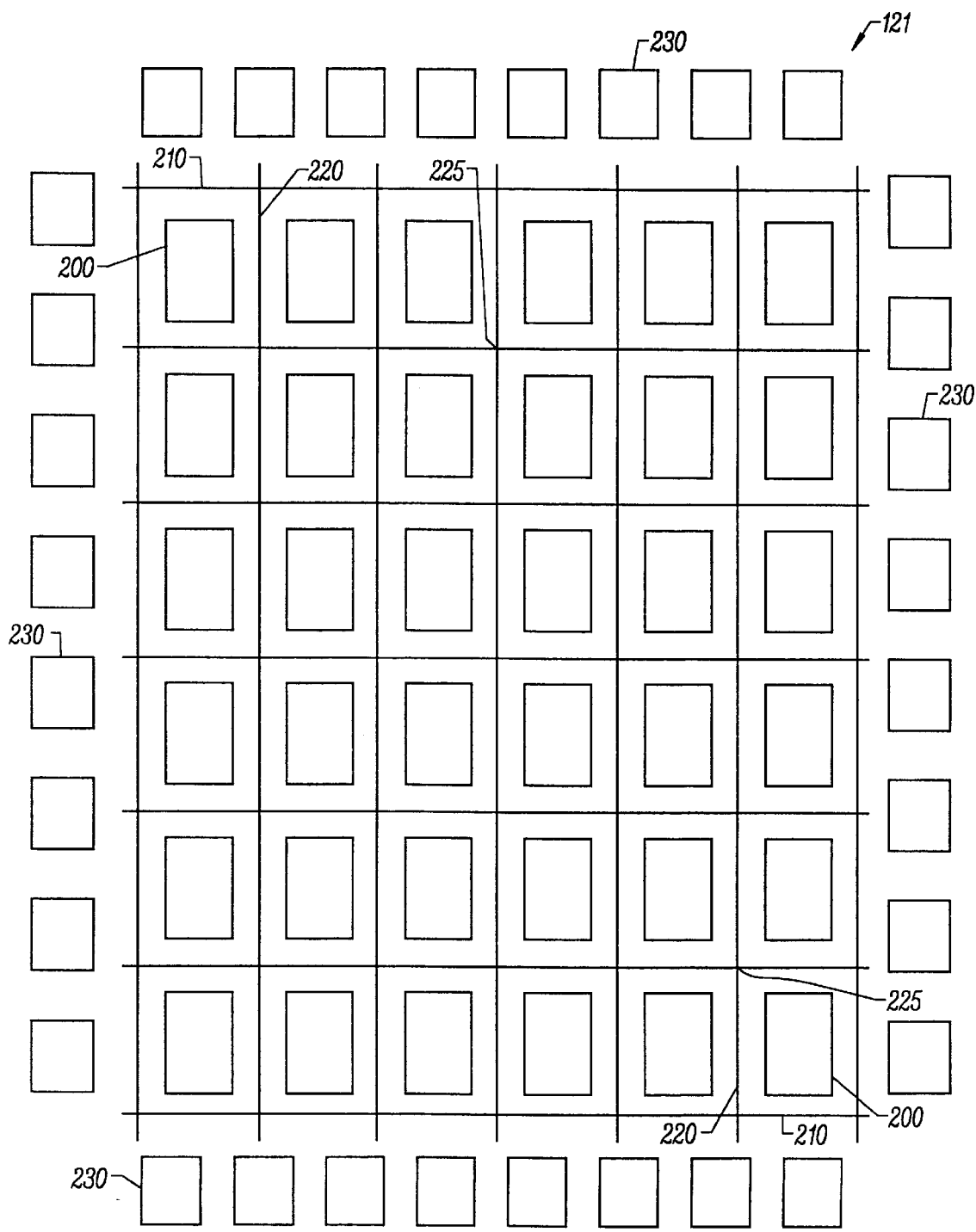
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments, only selected GH 210 conductors are programmably connectable to a selection of GV 220 conductors. Furthermore, in still further embodiments, GH 210 and GV 220 conductors may be specifically used for passing signals in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output driver takes internal signals and interfaces them to the outside world. A bidirectional driver performs the functions of both a input driver and an output driver. In addition, a bidirectional driver has a high-impedance mode which allows the driver to interface with a bidirectional bus. In other embodiments of the present invention, a PLD may have dedicated input drivers and dedicated output drivers, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
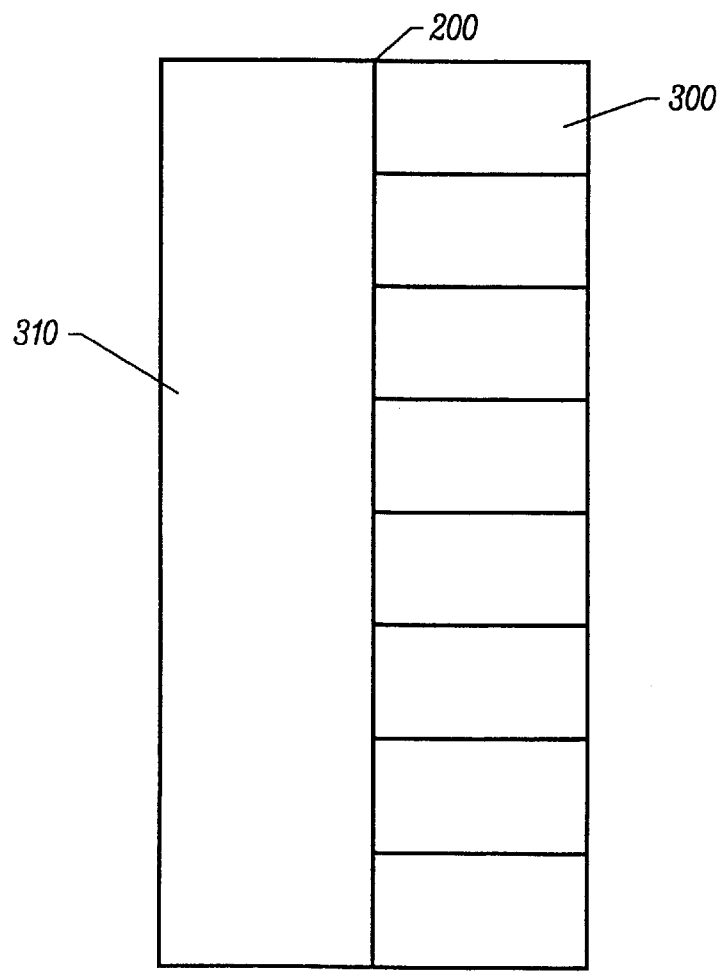
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LEs 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

A memory cell may be used in various places in a PLD. For example, a memory cell may be used to implement and store the configuration of a look-up table, function generator, programmable interconnect, and other components of the PLD. Using a memory cell, a RAM may be constructed that will be used to implement the look-up tables used in LEs 300. A memory cell may also be as a storage bit. This storage bit may be used, for example, to determine whether an LE is in registered or sequential mode. The storage bit may also be used to configure the operation of a programmable multiplexer.

Figure 4:
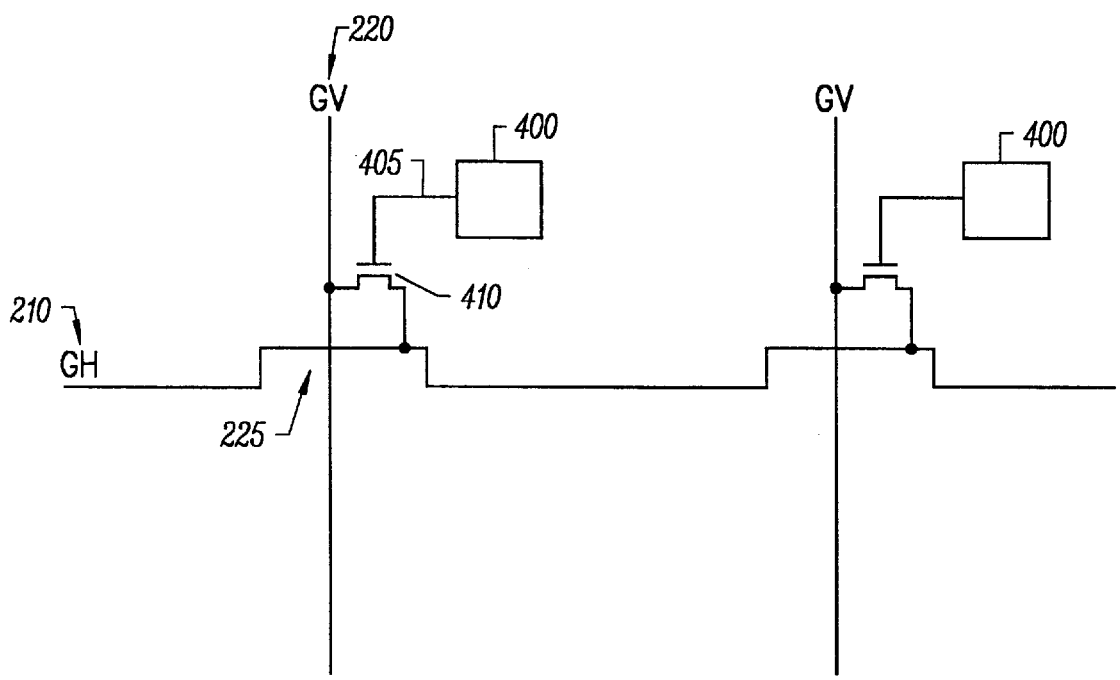
FIG. 4 is a diagram of the memory cell of the present invention used in the programmable interconnect of a programmable logic device.

FIG. 4 is a diagram showing an example of how memory cells may be used in the implementation of the programmable interconnection resources of a PLD, such as shown in FIG. 2. Memory cell 400 is a programmable memory cell. Memory cell 400 stores a logic state, either a high or low logic state. Depending on the polarity of the logic, a logic high state may be a "one" while a logic low state may be a "zero."

Memory cell 400 is reprogrammable, which means that the cell may be programmed many times with new data. Furthermore, in the present invention, memory cell 400 is nonvolatile, which means that the stored information is retained even when power is removed. For example, after memory cell 400 is programmed with a particular logic state, memory cell 400 stores this information indefinitely until the cell is reprogrammed.

Memory cell 400 has an output or sensing node 405 for outputting its stored state. Sensing node 405 provides either a low level or a high level, representative of the state stored in memory cell 400. The voltage levels at sensing node 405 are typically full-rail voltages, about equal to either the VDD (sometimes referred to as VCC) or VSS of the integrated circuit. However, the full-rail voltages at sensing node 405 may also be different from the supply voltages of the integrated circuit. For example, an integrated circuit may have a VDD of 5 volts and a VSS at ground. Memory cell 400 may have "local" supply voltages of 3.3 volts and ground. Then, the output voltage levels at sensing node 405 will be about 3.3 volts and ground.

Memory cell 400 may be used to implement many types of logic elements and components. For example, memory cell 400 may be used to implement a flip-flop, register, storage bit, architecture bit, lookup table, programmable interconnect array, RAM, SRAM, ROM, EPROM, EEPROM, content-addressable memory (CAM), PLD, FPGA, PC Card memory card, and other similar memory elements and devices. For example, as shown in FIG. 4, memory cell 400 may be used to implement the programmable interconnection resources of a PLD.

In FIG. 4, GH 210 and GV 220 conductors cross at intersections 225. As is typically the case with global programmable interconnect, GH 210 and GV 220 lines do not connect at intersections 225 unless they are programmably coupled. A pass transistor 410 and programmable memory cell 400 facilitate the programmable coupling of GH 210 to GV 220, and vice versa. In particular, depending on the data stored in memory cell 400, GH 210 and GV 220 conductors are programmably connected or programmably disconnected at intersection 225.

At intersection 225, pass transistor 410 is coupled between GH 210 and GV 220. A gate of pass transistor 410 is coupled to sensing node 405 of memory cell 400. Controlled by way of memory cell 400, pass transistor 410 programmably couples GH 210 to GV 220. For example, GV 220 and GH 210 may be connected together by storing a logic high in memory cell 400. Memory cell 400 would output a high level at sensing node 405, which is passed to the gate of pass transistor 410. A high at the gate of pass transistor 410 turns pass transistor 410 on, so that GV 220 is electrically coupled to GH 210. In the alternative, GV 220 and GH 210 may be disconnected from another by programming a zero into memory cell 400. In this manner, memory cell 400 of the present invention may be used to implement a global programmable interconnect structure of a PLD.

Furthermore, as discussed earlier, the present invention provides full-rail or "local" full-rail voltages at the gate of pass transistor 410. Therefore, pass transistor 410 will be either substantially on or substantially off. This allows GHs 210 and GVs 220 to conduct signals throughout the integrated circuit with generally good performance characteristics. For example, when pass transistor 410 is fully on (e.g., the gate is at VDD), the amount of resistance of pass transistor 410 is kept at a minimum, thus improving transient performance. Also, VDD at the gate of pass transistor 410 allows a voltage of about VDD-VT (a threshold voltage of pass transistor 410, including body effect) from one GH 210 or GV 220 conductor to another. Also, when pass transistor 410 is fully off (e.g., the gate is at VSS), no signals will pass (or "leak") from GH 210 or GV 220 conductor to another. Further, when pass transistor 410 is fully off, the GV 220 conductors intersecting a particular GH 210 conductor will not capacitively load that particular GH 210 conductor. These features improve the performance of the programmable logic device integrated circuit.

Pass transistor 410 may be fabricated using many different process technologies, including CMOS, NMOS, PMOS, and bipolar. In FIG. 4, pass transistor 410 is an NMOS transistor.

Figure 5A:
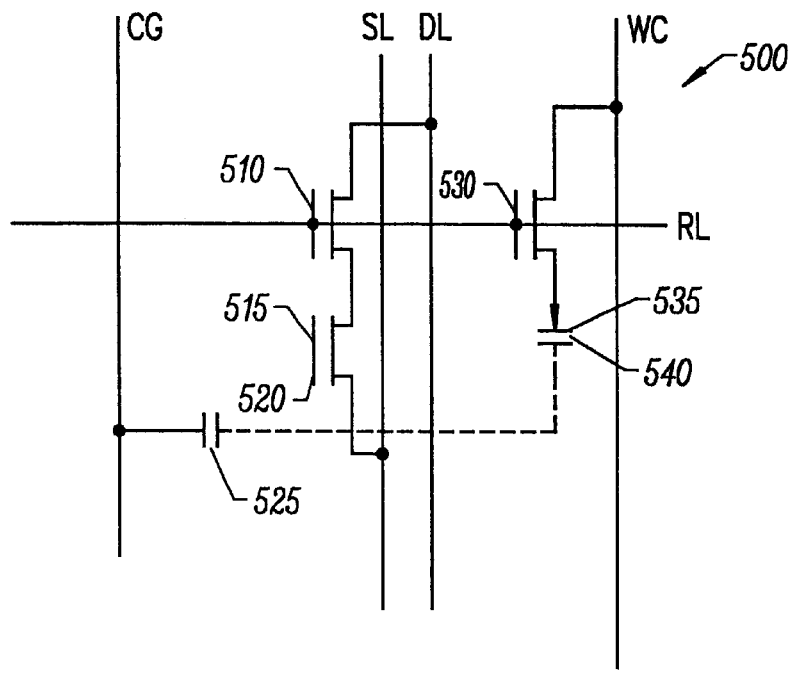
FIG. 5A shows a memory cell having a read device, program device, and write device.

FIG. 5A shows a diagram of a nonvolatile memory cell 500 which may be used to store data. This figure shows an example of a layout for memory cell 500. There are many other layout organizations for the memory cell, depending on the process technology used, silicon area available, performance criteria, and other factors. The principles of the present invention would be applicable to other layouts and configurations of memory cells, with suitable changes.

An array of memory cells may be formed by replicating (and possibly mirroring) a single cell 500 in vertical and horizontal directions. Using this technique, an array of any arbitrary desirable size may be formed. For example, an array may be arranged in 2×2, 1024×8, 16M×1, or many other organizations. The particular organization may also be reconfigurable or dynamically reconfigurable, selected by the user. A particular cell in the array may be selectively accessed or configured by row and column. One technique, among others, is to access cells through row and column address and decoding.

Figure 6:
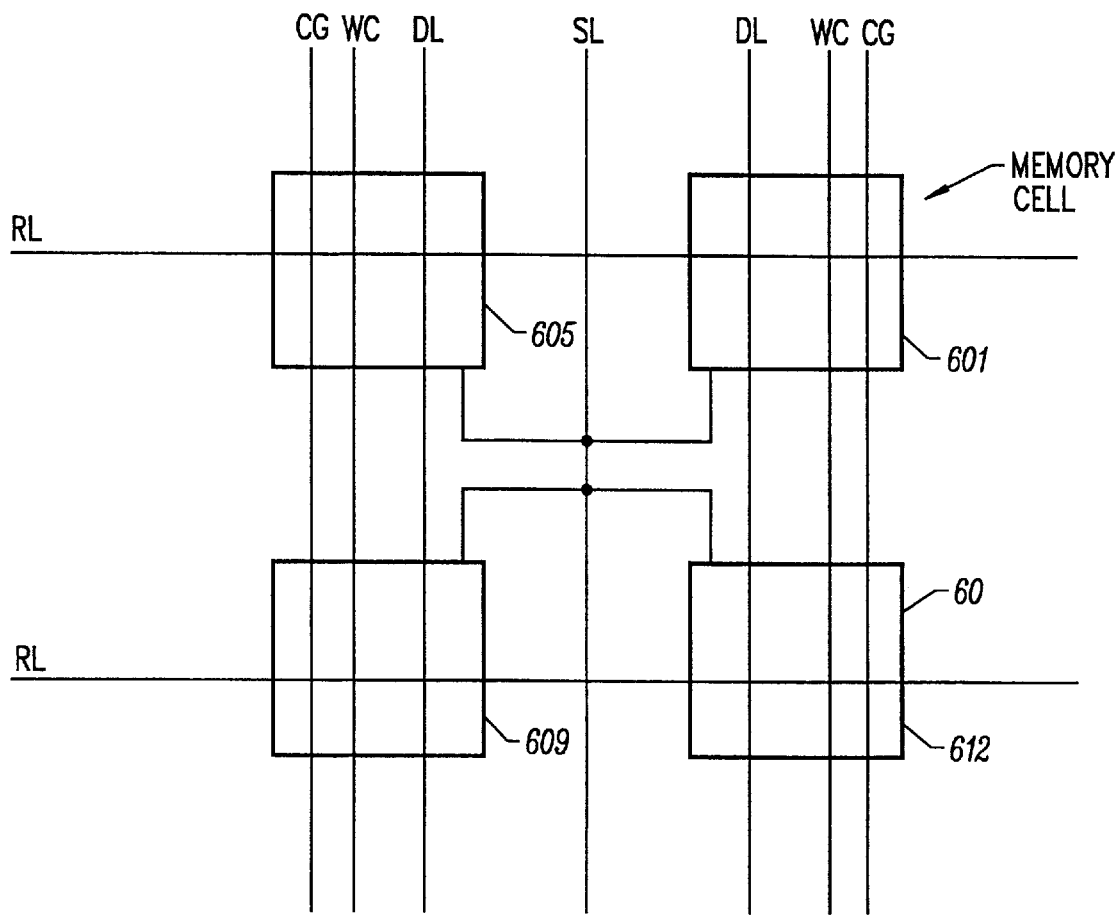
FIG. 6 shows a block diagram of an array of memory cells.

FIG. 6 shows an example of a 2×2 array of memory cells 500 and control wires coupling to these cells. Larger arrays may be similar formed. There are also many other array configurations than that shown in FIG. 6. By using the appropriate control lines, the functionality and stored state of each of the memory cells is accessible.

By appropriately configuring memory cell 500, a binary "0" or "1" is stored. Memory cell 500 is nonvolatile so that the stored data is retained even when power if removed from the integrated circuit. The stored data may be read from the cell and used for many purposes. For example, in a programmable logic device, the stored data may be used to determine whether a GH line is coupled to a GV line, or may be used to perform logic using gates, product terms, function generators, and look-up tables, to name just a few. Memory cell 500 may also be used in other types of integrated circuits such as microprocessors, memories, DSPs, and ASICs.

Memory cell 500 includes a read device 510 in series with a program device 515, coupled between a drain line (DL) and a source line (SL). In an embodiment, read device 510 is an NMOS transistor having a gate coupled to a row line (RL). Program device 515 may be a floating gate device having a floating gate 520 such as a EEPROM or Flash cell. In FIG. 5A, the devices shown are n-channel devices; however, the program device and other devices may be p-channel or PMOS devices. A memory cell may also contain combinations of NMOS and PMOS devices. However, with existing process technologies, the cell size will be more compact when all devices are of the same type due to well spacing and other factors. However, as technologies evolve, compact cell sizes will be possible with mixed device types using processes such as silicon over insulator (SOI). A control gate (CG) line to facilitate programming and erase through a control gate coupling capacitor 525 is coupled to floating gate 520. A write control (WC) line is coupled through a write device 530 through a tunnel diode 535 to floating gate 520. In a specific embodiment, write device 530 is an NMOS transistor having a gate coupled to RL.

Tunnel diode 535 is a source of electrons for floating gate 520, which are passed through a tunnel dielectric 540 (which is a relatively thin oxide region) to floating gate 520. In a specific embodiment, the tunnel dielectric will be about 80 Angstroms to about 100 Angstroms. In other embodiments, the tunnel dielectric may be about 100 Angstroms to about 110 Angstroms. The tunnel dielectric thickness is dependent on many factors such as the process technology, and the supply voltage for the technology (e.g., 5-volt process, 3.3-volt process, or 2.5-volt process). In comparison, using present-day process technology, a gate oxide will typically be about 50 Angstroms to about 70 Angstroms, or thinner.

Although FIG. 5A is an implementation of a memory cell using an NMOS program device 515, the principles of the present invention will apply analogously to the case where program device is a PMOS or p-channel device.

Figure 5B:
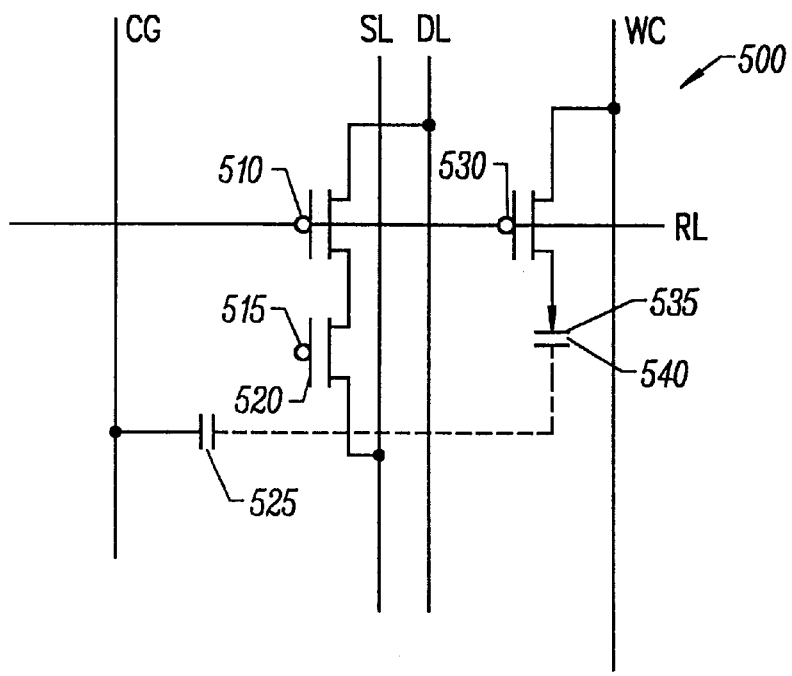
FIG. 5B shows a memory cell having a read device, program device, and write device, where the devices are p-channel devices.

FIG. 5B shows such a configuration, where program device 515, read device 510, and write device 530 are PMOS devices. This detailed description discusses operation primarily with respect to an NMOS version of the memory cell, which is generally more widely available. However, it is understood that this discussion of an NMOS memory cell would apply similarly (by duality) to the PMOS device configuration. For example, for the PMOS device configuration, the voltages and conditions applied to the cell would be reversed; e.g., "positive" values would become "negative" values, and vice versa. Aside from these differences, the principles of the present invention would apply equally as well to a PMOS memory configuration as an NMOS memory configuration.

The configuration of memory cell 500 involves programming or erasing program device 515. Depending on the memory technology used, the terms "programmed" and "erased" may have different meanings. In this specification, the IEEE convention for these terms is used. Specifically, "programmed" refers to placing a switch into an "off" or nonconducting state, and "erased" refers to placing a junction into an "on" or conducting state. High voltages may be used to transfer charge to and remove charge from the floating gate through tunnel oxide dielectric 540 by various physical mechanisms such as avalanche injection, channel injection, direct quantum-mechanical tunneling, Fowler-Nordheim tunneling, hot electrons, and other phenomena.

There are many considerations when operating, programming, and erasing memory cells, and these considerations are important in understanding the present invention. Further details of the operation, program, and erase of nonvolatile devices such as EEPROM and Flash cells are discussed in U.S. Pat. No. 5,581,501, application Ser. No. 08/701,416, and application Ser. No. 08/741,082, all incorporated herein by reference for all purposes.

High voltages facilitate the program and erase of the memory cell. A high voltage (VPP) used to program the memory cell may be somewhat different from a high voltage (VEE) used to erase the memory cell. The magnitude of VPP and VEE depends on the physical characteristics of the memory cell including such considerations as the thickness and composition of the dielectric between the substrate and the floating gate. Typically, VPP and VEE voltages are in the range of approximately 10 volts to 16 volts. However, as process technology continues to improve, it will become possible to fabricate thinner and better tunnel oxide dielectrics. Consequently, the high voltages needed to program and erase the programmable junction may decrease in magnitude. These high voltages may be generated on-chip by circuits such as charge pumps or voltage generators; or provided from sources external to the integrated circuit.

To erase program device 515, charge is electrically removed from the floating gate using high voltages and quantum-mechanical tunneling. After erasure, the program device may be reprogrammed. Flash EEPROM cells are generally programmed using hot electrons, while EEPROM cells are programmed using quantum-mechanical tunneling. In some cases, Flash EEPROM cells are programmed using quantum-mechanical tunneling. EEPROM and Flash cells may be programmed, erased, and reprogrammed many times for the lifetime of the device.

The memory cell shown in FIG. 5A may use EEPROM or Flash cells. When using Flash cells, the CG line in FIG. 5 should be decoded. To facilitate this, CG may be run in a direction parallel to RL. This would more easily facilitate decoding and a compact cell size since RL is decoded, and a decoder for GC may be layered out in the same or similar cell pitch as an RL decoder. This would allow a more compact cell size since only one dimension of the cell would need to be wide enough to accommodate a decoder.

When the program device is programmed, charge is placed on a floating gate and in so doing, program device 515 is placed in a high threshold voltage state (VTP or high VT). The floating gate retains this charges state indefinitely, even when power is not supplied to the programmable junction; this provides nonvolatility. In the programmed or high VT state, a reasonable voltage on CG will not turn on program device 515.

A reasonable voltage may be, for example, a voltage between the supply voltages of the integrated circuit, VDD and VSS; program device 515 will not conduct. A reasonable voltage may also be greater than VDD. However, in the case when a voltage above VTP is placed at CG, the program device may turn on. For EEPROM and Flash EEPROM technology, the typical threshold voltage for a memory cell in a high VT state (i.e., VTP) is, for example, approximately 6 volts. Moreover, when programmed using an "assist" technique (described below), the high VT state may be somewhat higher then 6 volts. For example, with CG at 2 volts, in the high VT state, program device 515 will be nonconducting or off.

When erasing the memory cell, charge is removed from the floating gate, and the program device is placed in a low VT state (VTE). The floating gate retains this erased state for the life of the memory cell, even when power is not supplied. In the erased or low VT state, a reasonable voltage on a gate of the memory cell will turn the memory cell on. For Flash EEPROM technology the typical threshold voltage for a low VT state ranges from approximately 0.5 volts to 2.5 volts. For EEPROM technology, this may range from approximately −3 volts to 0 volts.

When erasing using a "smart" algorithm, a specific low VT voltage level state may be achieved. For example, the VTE may be about −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, high-capacity Flash EEPROM memories. In other applications such as programmable logic devices, a negative low VT state may be allowable. For example, a negative VTE may be desirable in order to permit pass transistor 410 (in FIG. 4) to pass approximately full-rail voltages (e.g., VCC or VDD) between a GH and a GV. In this case, the program device would be analogous to an NMOS depletion device.

Typically, arrays of programmable cells are "initialized" to a particular first state, and then they are configured by changing selected cells to a second state. The initiation state of an array is chosen based on many considerations including the process technology selected to fabricate the cells and the intended use of the cells, as well as the interconnections within an array. For example, Flash EEPROM cells are typically initialized by bulk erasing the cells to a low VT state. In contrast, an array of EEPROM cells is typically initialized by bulk programming the cells to a high VT state.

CG activates program device 515. During normal operation, CG is coupled to a voltage level which activates and enables operation of the memory device. To activate program device 515, CG is coupled to a voltage level which is greater than VTE and less than the VTP. The voltage at the control gate may also be used to center a window of operation of the memory cell. For example, for typical EEPROM technology, a control gate voltage should be above about −1 volts (VTE) and less than about 5 volts (VTP). The control gate may be coupled to a switching signal line, which provides voltages between VSS and VDD. The control gate voltage may also be above VDD. This may be used to improve performance of the memory cell.

In a preferred embodiment, to provide the greatest amount of programming and erase margin, the control gate voltage is selected to be at approximately the center of VTE and VTP. For example, for EEPROM technology, the control gate voltage is set in the range from about 1.7 volts to about 2 volts. An activation voltage above VDD may also be used because among other reasons, this may be required by the memory element, or a higher voltage level is readily available. Also, this voltage level may center the window of operation of the memory cell. The control gate is also used during the programming of the memory cell, which is described in more detail below.

When utilizing EEPROM and Flash EEPROM technologies, the memory cell is erased using Fowler-Nordheim tunneling. For Flash operation, the memory cell (and corresponding program device) is initialized to an erased state. To initialize the program device to a low VT state, VEE+VTN (a threshold voltage of write device 530) is placed on RL. VEE is placed at WC. As discussed earlier, VEE is a high voltage used for erasing the devices. VEE is typically in the range of 10 volts to 16 volts. CG is held at a low voltage, grounded or negative. When erasing, a negative assist programming technique may be used by placing a negative assist voltage on the control gate. For example, a voltage of −3 volts may be placed on control gate 670. This would decrease VTE, improving the erase margin of program device 515.

DL and SL may be grounded or biased to a low value. VEE is passed through write device 530 to tunnel diode 535. Typically, one or more tunnel dielectrics 540 are positioned above tunnel diode 535. In operation, from tunnel diode 535 (an n+ region), electrons may tunnel, in both directions, through the tunnel dielectric via quantum-mechanical tunneling to and from floating gate 520. High voltage VEE at tunnel diode 535 attracts electrons from the floating gate 520 via Fowler-Nordheim tunneling. This makes floating gate 520 more positively charged, and places program device 515 in a low VT state. The VTE may be approximately −2 volts.

Using Flash technology, the memory cells in an array of such devices are selectively programmed. To program, program device 515 is programmed to a high VT state. VPP is placed on CG. As discussed earlier, VPP is a high voltage used for programming the memory cells. VPP is typically in the range of about 10 volts to about 16 volts. This voltage also depends on the technology used, and may be lower such as 10 volts. A VPD voltage is placed on SL. VPD is selected to optimize the efficient programming of the devices. These considerations include ensuring that program device 515 is programmed well, minimizing any destructive effects on the devices, and observing the current density constraints of the power conductors. In one embodiment, VPD is about 8 volts. However, VPD may be in the range from about 5 volts to about 11 volts. RL is set at a voltage sufficient to turn read device 510 on: This voltage should be sufficiently high to permit read device 510 to pass a programming current. For example, this voltage may be VPP or even higher. WC and DL are grounded.

Under these conditions, tunnel diode 535 is grounded; a significant current flows from SL through program device 515 and read device 510 to DL. For example, this current may be about five hundred microamps, or more. For example, current may be in the range from about five hundred microamps to seven hundred microamps. The range may be from about one hundred microamps to about one milliamp. There are devices which will program with currents of a few microamps, such as about one microamp to about 10 microamps or more. As technology improves, memory cells will be developed which will program with any desired range of currents. This current generates hot electrons, some of which jump a dielectric barrier (i.e., gate oxide or thin oxide) and become trapped in floating gate 520. Floating gate 520 becomes negatively charged. Program device 515 is programmed to a high VT state. VTP is typically 5 volts or higher.

In the above example, the programming current was generated in a direction from SL to DL. However, the programmable junction may also be programmed by similarly inducing a programming current from DL to SL. In this particular case, VPD will be placed at DL and SL is grounded. Although both techniques described may be used to program an array of programmable junctions, there are some advantages and disadvantages to these techniques.

It is an important consideration when programming selected programmable junctions in an array of programmable junctions to avoid altering or disturbing the programmed or erased state of the unselected programmed junctions. It is desirable that the unselected programmable cells remain in their programmed or erased state.

A potential problem is that the voltages and conditions used to induce the programming current for programming a programmable junction by hot electron programming may disturb other programmable junctions (possibly in the same or adjacent row or column). For example, this voltage may program unselected programmable junctions by Fowler-Nordheim tunneling. A technique of minimizing this disturb phenomenon is to fabricate the memory cell with a thicker tunnel oxide. This increases the voltage necessary to possibly disturb the devices by Fowler-Nordheim tunneling.

For EEPROM operation, the programmable junction is programmed and erased using Fowler-Nordheim tunneling. This may be referred to as full $E^2$ operation. The programmable junction is initialized by programming or bulk programming (for an array of cells) to a high VT state. CG is coupled to VPP. DL, SL, and WC are grounded. RL is placed at a voltage sufficient to turn write device on, which is about 2 volts or above. Electrons tunnel from tunnel diode 535, which is grounded, through tunnel dielectric 540 to floating gate 520. As a result, program device 515 is programmed to the high VT state. VTP is typically about 5 volts or higher.

VTP may be boosted to a higher value by using an "assist" programming technique. In assist programming, when programming a programmable junction, for example, SL is set at VDD. Since CG is VPP, the other terminal of program device 515 is also at about VDD. Under these conditions, more electrons become trapped in the floating gate than under the programming conditions described previously. Hence, the floating gate is programmed to a higher VTP.

Furthermore, this assist voltage may be any voltage above ground. For example, VDD may be used since this voltage is readily available. However, voltages above VDD, such as VPP, may also be used. Generally, the higher the assist voltage, the greater the boost in VTP. The assist voltage may be applied to SL, and also may be coupled to DL, provided that the voltage at RL is sufficient to pass this voltage to program device 515.

For EEPROM operation, memory cells in an array are selectively erased to a low VT state. The erase operation is similar to that described for Flash operation above. Specifically, CG is grounded or placed at a negative voltage (for negative assist programming as discussed above). WC is coupled to VEE. In order to pass VEE to tunnel diode 535, RL is coupled to VEE+VT or above. DL and SL may be floating or grounded. Electrons will tunnel from floating gate 520 through tunnel dielectric 540 to tunnel diode 535. Program device 515 is erased to a low VT state.

The present invention provides a technique for margin testing memory cells. During the fabrication and production of the memory cell, it is desirable to test and verify the programming and erase margins of the programmable junction cells. Programming and erase margin are the degree to which a cell when in one state (i.e., programmed or erased), may be differentiated from the other state. If there isn't sufficient programming margin, then the circuitry may be unstable; for example, a cell will only sometimes be in the desired or configured state depending on temperature and voltage conditions. Or, the circuitry may completely fail functionally. For example, when exercising a configured programmable junction, this programmable junction will not function as desired, causing logical errors. Hence, margin testing is important for ensuring the reliability and integrity of the circuitry on the integrated circuit.

A method of margin testing a programmable junction cell such as shown in FIG. 5A involves the following. During testing, program device 515 is utilized, and its margin is evaluated. There are many considerations when margin testing. For example, testing of margin could be influenced by other components coupled to the same control lines, causing inaccurate results. This is a similar problem as not disturbing adjacent memory cells when programming and erase memory cells. It is important that margin is accurately measured for the desired cell, and the results are not influenced by contributions, leakages, and other currents from other cells. Further, it is generally desirable to minimize any additional circuitry used to evaluate margin. This additional circuitry would unduly impact speed path performance due to increased loading, as well as other similar considerations.

To margin test, a memory cell to be tested is selected. Erase and program margin are evaluated similarly. For erase margin, the memory cell is initially in an erased state. For program margin, the programmable junction is initially in a programmed state. To evaluate margin, WC is grounded. DL is set to about 2 volts. SL is grounded. RL is used to select a program device 515 for testing and verification. For example, in an array, multiple cells may be coupled to the same DL and SL lines. A particular RL corresponding to the memory cell to be tested is set at a voltage to turn on read device 510, which may be approximately 2 volts or above. Other row lines for cells coupled to the same DL are set at a voltage to turn off the read device; this voltage may be about ground, or more specifically, below a threshold voltage of the read device.

A voltage supplied at CG is swept until program device 515 begins to conduct. This voltage is the threshold voltage for erase or program, depending on the state of the cell. This threshold voltage is an indication of the programming margin of the memory cell, and in particular, margin for when current flows in a first direction from DL to SL. In cases when margin testing erased cells with a VTE of zero volts or below, these cells will conduct even when the control gate is set at zero volts. In such a case, the conduction with a control gate voltage of zero volts may be used as an upper bound on VTE. Also, the magnitude of the conduction may be used to estimate the VTE in some cases.

Margin may also be evaluated for current flow in a second direction, SL to DL. The margin may be different under these dissimilar conditions; margin may be evaluated under both conditions to find the minimum value. To test margin for the SL-to-DL direction, the testing conditions are similar to those described above, except SL is coupled to about 2 volts, and DL is grounded. CG is swept until program device 515 begins to conduct. This voltage will be an indication of margin for the second direction.

A technique of the present invention for determining a zero or negative VTE is to evaluate by sweeping negative voltages on CG. A voltage range (including negative and positive voltages) is swept at CG to find the voltage at which program device 515 begins to conduct. For example, the voltage on CG may be swept from −3 volts to 2 volts. A negative voltage may be generated on-chip by a charge pump or other circuitry, or supplied from an external source. For the memory cell where negative voltages are coupled to CG, the control gate electrode should be wired in polysilicon rather than diffusion to prevent forward biasing a diode in the substrate (e.g., diode between n+ diffusion to p-substrate or p-well).

Another technique of the present invention for determining a zero or negative VTE is through the use of substrate bias. Specifically, for example, a p-well or substrate which contains program device 515 may be negatively biased. From principles of the semiconductor physics for transistors, as the body bias of a transistor becomes increasingly negative, the VT (being a function of body bias) increases. The function of VT versus VSB (substrate bias from source to bulk) is characterized by equations found in textbooks on semiconductor physics.

That is, $\Delta V_T$, the increase in $V_T$ as $V_{SB}$ increases, is given by $\Delta V_T = \alpha[(\beta+V_{SB})^{1/2} - \beta^{1/2}]$, where $\alpha$ and $\beta$ are constants of the structure which are determined by the gate oxide thickness and the dopant distribution in the transistor substrate.

Using these equations, given the substrate bias and voltages at the control lines of the memory cell, the VTE (at zero substrate bias) may be calculated. Hence, the margin may be evaluated using negative substrate biases. By using negative substrate biases, it is not necessary to provide negative voltages to the control lines (e.g., CG, WC, RL, DL, and SL). CG may be run in diffusion or polysilicon.

For example, the substrate or p-well of program device 515 is negative biased. This voltage may be about −3 volts. This negative voltage may be generated on-chip or provided from external sources. Then, as in the technique described above, a voltage range is swept at CG to find a voltage at which program device 515 begins to conduct. This is the VTE at that particular substrate bias (e.g., −3 volts). The VTE at zero volts substrate bias may be obtained by calculation, which gives the margin.

By negatively biasing the substrate, this effectively shifts the VTE voltage higher. In a specific embodiment of the present invention, a substrate bias voltage is selected so that VTE is shifted to be positive. Then, negative control line voltages (e.g., CG) are not necessary to evaluate the margin of program device 515. And, a somewhat negative VTE (at zero substrate bias), on the order of −1 volt, is measurable using this approach.

A further technique of the present invention for measuring margin, especially for determining a zero or negative VTE is through use of substrate bias by elevated source voltage during sensing. This technique has the advantage that negative voltages are not required, and it will work with typical memory cells (including single transistor cells); the memory cells do not require any additional or special processing to be use this technique. It has the further advantage that the gate voltage at $V_T$ is shifted positively by the sum of the $\Delta V_T = \alpha[(\beta + V_{SB})^{1/2} - \beta^{1/2}]$ discussed above, plus the entire value applied to $V_S$ (the voltage at the source node).

The technique involves elevating SL or source node of the program device 515 by a positive voltage or offset voltage. When a positive voltage is coupled to SL, without changing voltage coupled to the substrate (e.g., zero volts), there will be effectively a back bias, or positive VSB. Therefore, with an offset voltage on SL, this situation becomes similar to that of negative back biasing discussed above. Equations may be used to calculate the VTE at zero substrate bias, or zero source bias. Negative control line voltages (e.g., CG) are not necessary to evaluate the margin of program device 515. And, a negative VTE (at zero substrate bias) of several volts is measurable using this approach. This technique does not require negative voltages to be coupled to CG or the substrate.

When the source voltage (at SL) is elevated, referring to FIG. 5A, the voltages at CG, RL, and DL should be adjusted accordingly in relationship to the source voltage. For example, if the source voltage is 1 volt, the voltages at CG and DL should be elevated by about 1 volt in order to place the memory cell in a similar condition as in the case when the source voltage was ground. The voltage at RL may also need to be elevated in order to pass the increased voltage at DL. In other words, the elevated source voltage acts as an offset voltage. For example, when the source voltage is 1 volt and CG is coupled to ground, there is effectively a −1 volt VGS (gate-to-source voltage) bias on program device 515. In a specific embodiment, the offset voltage for the source node of program device 515 is selected so that the VTE of program device 515 may be measured without using negative CG and substrate voltages.

A further consideration when evaluating margin for an array of memory cells is to ensure memory cells in adjacent rows and columns do not affect the measurement. A technique is to decouple adjacent cells from the commonly accessed control lines. For example, referring to FIG. 6, cells 605 and 609 share the same DL line. In an array of cells with the configuration shown in FIG. 5A, any one cell may be selectively coupled to DL by activating RL for only the selected cell. For adjacent cells along the same RL, the respective control lines (e.g., SL, DL, WC) should be coupled to voltages such as ground or VDD to prevent disturbing the adjacent cells.

The use of an elevated source voltage may also be used during the normal operation of the memory cells. Flash and EEPROM cells generally have a long, but finite service life due to the degradation in the physical properties of the cells. One of the properties which may vary and degrade during the lifetime of the cell is the VTE voltage of the cell. For example, as the cell ages, the VTE may become more positive so that it is misread as a programmed cell.

For example, during operation, a sense amplifier or other circuitry is used to determine whether a memory cell is in a programmed or erased state. The sense amplifier has a window of operation. When VTP is above about 6 volts, for example, the sense amplifier will indicate an "off" cell. And, when VTE is below about 0.5 volts, the sense amplifier will indicate an "on" cell. This voltage range is the window the sense amplifier uses to accurately read the contents of the memory cell. This is a 5.5-volt window. During the service life of the memory cell, the VTE voltage may drift above 0.5 volts. And, when the VTE is significantly above 0.5 volts, this may cause the sense amplifier to misread the memory cell contents. An erased cell will appear to be a programmed cell, and this will cause logic errors, which is not desirable.

By using elevated source voltages, the VT window for the memory cells may be adjusted or self-adjusted so that the service life of the integrated circuit is extended. Furthermore, PLDs generally do not take advantage of a wide window between VTE and VTP, especially when VTE is negative because a VTE of zero volts is presumed. Part of the reason for this is that previously negative VTEs were not measurable. However, the discussion above provides several techniques for their measurement. A further problem is that positive voltages are typically used within the integrated circuit to switch the logical and memory cell circuitry. As is typical for TTL and CMOS logic, voltages below ground are not used for logic.

However, using the technique of the present invention of providing an offset voltage to SL of the memory cells, this allows the VTE to be shifted into the positive range. The voltage at CG during normal operation may also need to be adjusted. The VTP for a memory cell with elevated source voltage is also similarly shifted up. Therefore, the entire window between VTE and VTP will increase, for example, from 0.5 volts and 6 volts, to for example, 0.5 volts to 7 volts by coupling 1 volt to SL during normal operation. The entire window between erased and programmed cell has increased by 1 volt. This increases the service lifetime of the memory cells since there is a larger difference and hence, easier determination of whether a cell is erased or programed. By using an elevated source voltage at the source of the memory cells, this increases the operational window of circuitry without the use of negative voltages.

The value of the offset voltage to couple to SL depends on many factors, and should be a value above ground. These factors include the process technology used, typical VTE, reference voltage circuitry, power supply voltages, and others. The voltage may be, for example, any voltage up to 1 volt such as 0.1 volts, 0.2 volts, 0.3 volts, 0.4 volts, 0.5 volts, 0.6 volts, 0.7 volts, 0.8 volts, 0.9 volts, and others. For example, the offset voltage may be any value 1 volt or above such as 1 volt, 2 volts, 3 volts, and even in certain applications, voltages above 3 volts. The offset voltage may be noninteger voltages such as 1.2 volts, 1.6 volts, 1.7 volts, 1.8 volts, 1.9 volts, 2.1 volts, 2.2 volts, 2.3 volts, 2.4 volts, and 2.5 volts, just to name a few. The offset voltage may in the range from about ground to about 1 volt, from about 1 volt to about 2 volts, from about 2 volts to about 3 volts, and from about 3 volts to about 4 volts. The offset voltage should be below the VDD of the integrated circuit in order to enable operation of the memory cell. Furthermore, the offset voltage may vary during operation of the integrated circuit accounting for variations in power supply voltage changes, temperature, process technology variations, and other factors.

By using an offset voltage on SL, the window of operation may be centered so to give similar erase and program margins. Specifically, although the previous discussion primarily focused on measurement of erase margin (i.e., VTE), program margin is also important. Analogous to VTE, there may be variations in VTP over the lifetime of the memory cell also. As a memory cell ages, the memory cell may fail due to a programmed cell being misread as an erased cell. Therefore, it is desirable to provide similar degrees of erase and program margin. By centering the window of operation, the erase and program margins may be set more similarly. This will provide greater overall integrated circuit longevity and reliability.

For example, a sense amplifier (coupled to DL) used to sense the contents of the memory cell may have a trip voltage of about 1.8 volts. The VTE and VTP may provide a window of 0.2 volts and 2.2 volts, respectively. In this case, there is greater erase margin (i.e., 1.6 volts) compared to program margin (i.e., 0.4 volts). An offset voltage may be coupled to SL so that the window is shifted to 0.8 volts and 2.8 volts, which would give 1 volt of program and erase margin. Therefore, a positive source voltage may be used to increase the longevity of the memory cell.

FIGS. 7–10 show different embodiments of memory cells where the above techniques for measurement of a threshold voltage of program devices may be applied, especially in the case of measuring negative VTEs. Furthermore, the technique of using an elevated source voltage for the memory cell may also be applicable.

Figure 7:
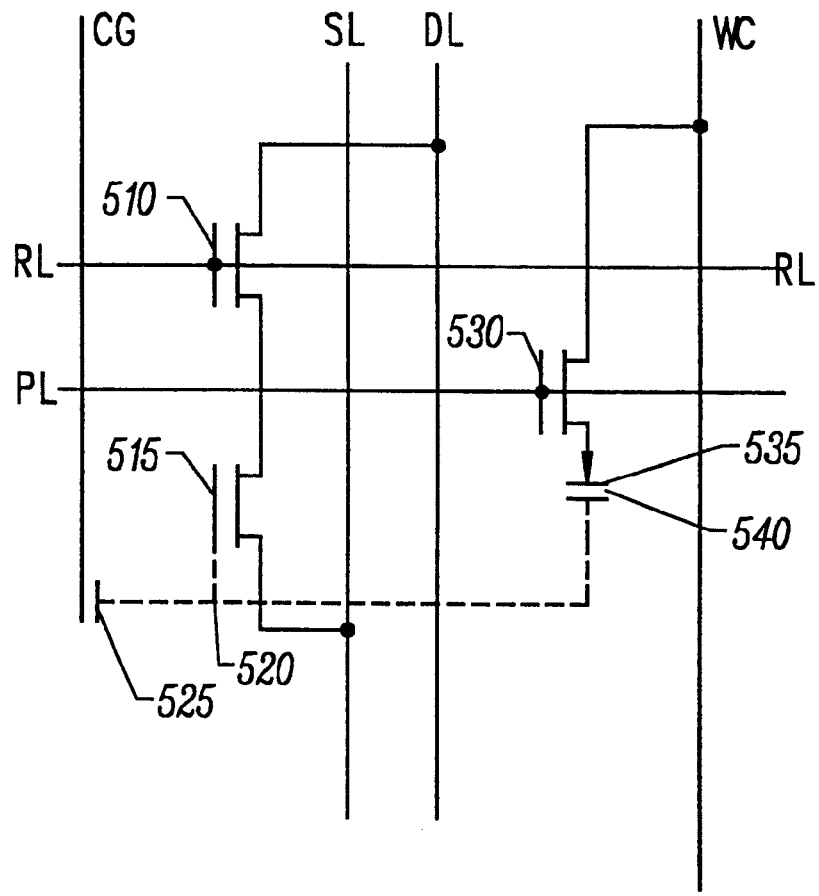
FIG. 7 shows a memory cell where a read device and program device has gates connected to different control lines.

FIG. 7 shows an embodiment of a memory cell similar to that in FIG. 5A where the gate of write device 530 is coupled to a separate program line (PL). Like reference numerals correspond to similar features described for FIG. 5A. The operation of the cell is similar to that discussed above for the cell in FIG. 5A, except during programming, the PL control line is used to separately control coupling of the WC line to tunnel diode 535. A negative VTE for program device 515 may be measured using the techniques described above: use of negative voltages on CG, use of negative substrate voltages, or elevated source voltage for the memory cell. Further, an elevated source voltage may be used during normal operation of the memory cell to provide the benefits discussed above.

Figure 8:
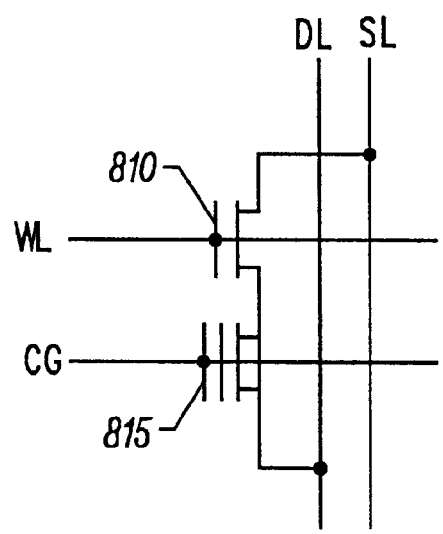
FIG. 8 shows a memory cell having a read device and program device.

FIG. 8 shows a memory cell having a read device 810 and a program device 815. In a specific embodiment, read device 810 is an NMOS transistor and program device 815 is a double polysilicon floating gate device (e.g., EEPROM or Flash). These are coupled between SL and DL. WL is coupled to a gate of read device 810. CG is coupled to a gate of program device 815. A negative VTE for program device 515 may be measured using the techniques described above: use of negative voltages on CG, use of negative substrate voltages, or elevated source voltage for the memory cell. Further, an elevated source voltage may be used during normal operation of the memory cell to provide the benefits discussed above.

Figure 9:
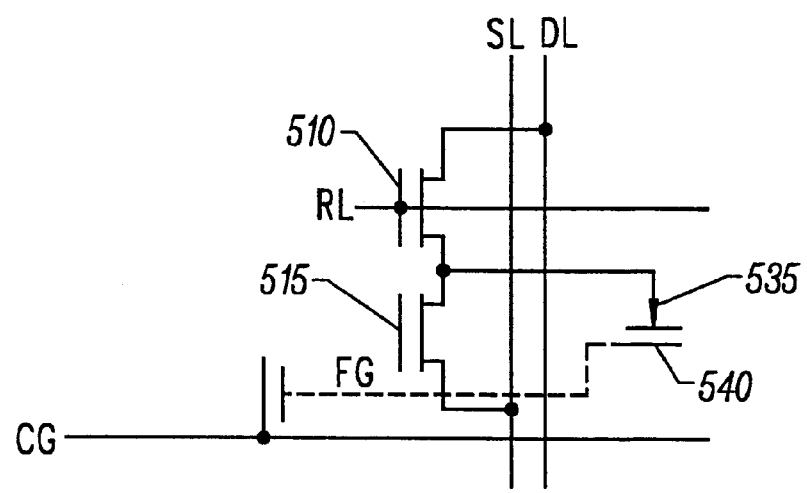
FIG. 9 shows a memory cell where the read device also performs the functions of a write device.

FIG. 9 shows a memory cell having some similar features as the configuration shown in FIG. 5A. In this configuration, there is not a separate write device 530; however, read device 510 is also coupled to perform a similar purpose as write device 530. The technique described above for measuring a negative VTE of program device 515 remains applicable. The use of negative voltages on CG, use of negative substrate voltages, or elevated source voltage for the memory cell are applicable. Further, an elevated source voltage may be used during normal operation of the memory cell to provide the benefits discussed above.

Figure 10:
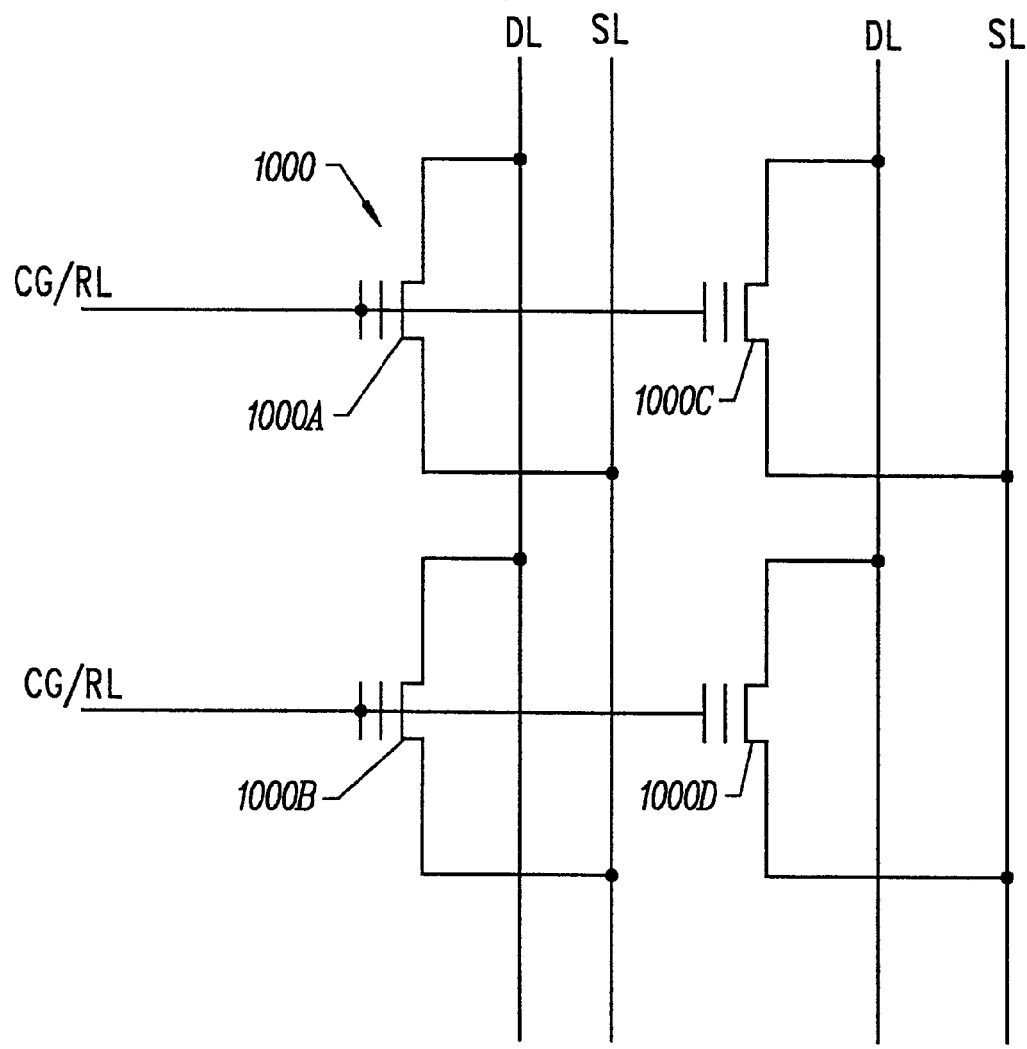
FIG. 10 shows an array of single transistor memory cells.

FIG. 10 shows a 2×2 array of memory cells 1000, where each cell is a double-polysilicon single-transistor cell. For example, memory cell 1000 may be an EEPROM, Flash, or other floating gate device. These calls may be used to store data. As an example of a particular application, in a programmable logic device, each of the cells may be used to control a pass transistor 410 for interconnecting a GV and GH in FIG. 4. A floating gate from memory cell 1000 may be shared with a gate of transistor 410.

To evaluate a negative VTE of a memory cell 1000, the techniques described above may be used. As discussed above, for an array of cells, adjacent cells are decoupled from DL. For example, to evaluate margin for memory cell 1000A, memory cell 1000B may be decoupled from DL according to similar principles as described above. This avoids having multiple cells conducting during margining.

Memory cell 1000B may be decoupled by placing a negative voltage below the VTE of the device at CG/RL. Another technique for decoupling memory cell 1000B is to negatively bias the substrate voltage for memory cell 1000B sufficient to turn off memory cell 1000B when a zero or positive voltage is placed at CG/RL of memory cell 1000B. A still further technique of decoupling memory cell 1000B is to use an elevated source voltage at SL for memory cell 1000B, sufficient to turn off memory cell 1000B when a zero or positive voltage is placed at CG/RL of memory cell 1000B. By placing a voltage of at least a Vt| of an erased memory cell (i.e., |VTE|) at the SL or source of memory cell 1000B, this will ensure a zero or positive voltage at CG/RL of memory cell 1000B will turn the cell off, thus decoupling it from the DL line.

After adjacent cells sharing the same DL line have been decoupled, the VTE of memory cell 1000A may be evaluated using one of the techniques described above: use of negative voltages on CG, use of negative substrate voltages, or elevated source voltage for the memory cell. Further, an elevated source voltage may be used during normal operation of the memory cell to provide the benefits discussed above.

Another benefit for cells (such as those in FIGS. 8, 9, and 10) in which the conducting path for SL to DL is directly in contact with the tunnel oxide, is that the use of an elevated source voltage during normal operations may be selected to relax the stress on the tunnel oxide during storage with power off. For example, to equalize the stress on the tunnel oxide, it may be desirable that the floating gate voltage for the programmed and erased states in storage by symmetrically arranged around 0 volts. If possible, floating gate voltages of around −2 volts and +2 volts might be chosen for the programmed and erased states, respectively. By choosing positive source voltages during normal operation, $V_T$ can be offset so that even the erased cell with +2 volts floating gate voltage during storage, can be turned off without application of negative gate bias. In this way, even single transistor cells can achieve relaxed tunnel oxide stress during storage. This can be used to increase the longevity of the memory cells.

Figure 11:
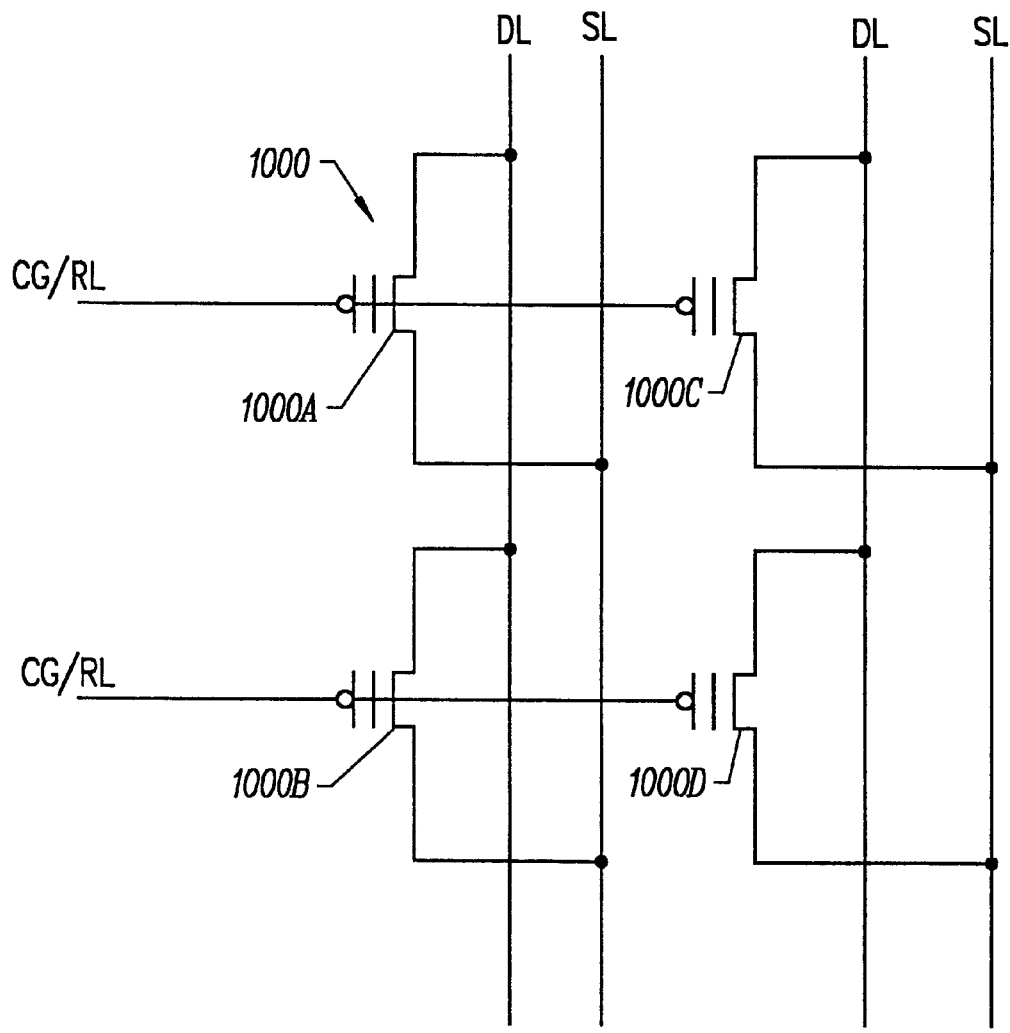
FIG. 11 shows an array of single p-channel transistor memory cells.

As was the case for FIG. 5 discussed above, the embodiments of memory cells in FIGS. 7–10 may also be similarly implemented using p-channel devices. For example, FIG. 11 shows an example of an array of PMOS single transistor memory cells. The principles and techniques of the present invention would be applicable to memory cell configurations with PMOS devices with the appropriate changes.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method of evaluating a margin of a memory cell comprising:

selecting a memory cell;

decoupling memory cells adjacent to the selected memory cell by placing a negative voltage on control gates of the adjacent memory cells; and evaluating a margin of the selected memory cell.

2. The method of claim 1 wherein the memory cell is a floating gate device.

3. The method of claim 1 wherein the memory cell is a Flash technology programmable device.

4. The method of claim 1 wherein the memory cell is an EEPROM technology programmable device.

5. A method of evaluating a threshold voltage of a program device comprising:

sweeping a voltage range including negative voltages at a control gate line of the program device; and determining a voltage at which the program device begins to conduct.

6. The method of claim 5 wherein the program device is a floating gate device.

7. The method of claim 1 wherein the adjacent memory cells are coupled to a drain line and the selected memory cell is coupled to the same drain line.

8. The method of claim 1 wherein the negative voltage is a voltage level less than ground.

9. The method of claim 1 wherein the negative voltage is a voltage level less than or equal to about −1 volt.

10. The method of claim 1 wherein the negative voltage is a voltage level less than or equal to −2 volts.

11. The method of claim 1 wherein the negative voltage is a voltage level less than or equal to about −3 volts.

12. The method of claim 1 wherein the negative voltage is generated on-chip.

13. The method of claim 1 wherein the negative voltage is provided from a source external to an integrated circuit with the memory cell.

14. The method of claim 1 wherein evaluating a margin of the selected memory cell comprises determining a threshold voltage for the selected memory cell.

15. The method of claim 12 wherein the negative voltage is generated by a charge pump.

16. The method of claim 1 wherein evaluating a margin of the selected memory cell will determine if the selected memory cell has a negative threshold voltage.

17. The method of claim 5 wherein the program device is a Flash transistor.

18. The method of claim 5 wherein the program device is an EEPROM transistor.

19. The method of claim 5 wherein the negative voltages includes a voltage level of about −3 volts.

20. The method of claim 5 wherein the voltage range is from about −3 volts to about 2 volts.

21. The method of claim 5 wherein the negative voltage is generated by an on-chip charge pump.

22. The method of claim 5 wherein the negative voltage is provided by an external supply.

23. The method of claim 5 wherein the voltage at which the program device begins to conduct is a negative voltage level.

24. The method of claim 5 wherein the negative voltages includes a voltage level in a range from about −3 volts to less than about 0 volts.

* * * * *